(12) United States Patent
Drakshapalli et al.

(10) Patent No.: US 9,329,614 B1
(45) Date of Patent: May 3, 2016

(54) BANDGAP WITH THERMAL DRIFT CORRECTION

(71) Applicant: Cirrus Logic, Inc., Austin, TX (US)

(72) Inventors: Prashanth Drakshapalli, Austin, TX (US); John L. Melanson, Austin, TX (US); Rod Holley, Spicewood, TX (US); Thirumalai Rengachari, Austin, TX (US); Ruoxin Jiang, Austin, TX (US); Eric Swanson, Buda, TX (US)

(73) Assignee: Cirrus Logic, Inc., Austin, TX (US)

( * ) Notice: Subject to any disclaimer, the term of this patent is extended or adjusted under 35 U.S.C. 154(b) by 39 days.

(21) Appl. No.: 13/837,830

(22) Filed: Mar. 15, 2013

Related U.S. Application Data

(60) Provisional application No. 61/677,503, filed on Jul. 31, 2012.

(51) Int. Cl.
*G05F 3/02* (2006.01)
*G01R 31/28* (2006.01)
*G01R 31/30* (2006.01)
*G01R 31/317* (2006.01)
*H01L 21/66* (2006.01)

(52) U.S. Cl.
CPC .............. *G05F 3/02* (2013.01); *G01R 31/2884* (2013.01); *G01R 31/3004* (2013.01); *G01R 31/31701* (2013.01); *H01L 22/34* (2013.01)

(58) Field of Classification Search
CPC ........... G05F 3/267; G05F 3/30; G05F 1/561; H03M 3/43; H03M 3/34; H03M 3/438; H03M 1/365; H03M 1/162; H03F 2200/33; H03F 1/304; H03F 1/301; H03F 1/523; H03F 3/505; Y01S 323/907; H03G 1/0082; H01L 27/0214; H01L 27/0688; H03K 5/15
USPC .................. 324/750; 257/252, 467, E29.347, 257/E29.014; 327/93–124, 336, 510–513, 327/527–543; 323/300–320, 907; 363/73; 341/118, 143; 330/259
See application file for complete search history.

(56) References Cited

U.S. PATENT DOCUMENTS 7,392,152 B2 * 6/2008 Inukai ..................... G01K 7/425
702/150
7,760,036 B2 * 7/2010 Sutardja .................... 331/108 C
(Continued)

OTHER PUBLICATIONS

Hilbiber, D.F. (1964), "A new semiconductor voltage standard", 1964 International Solid-State Circuits Conference: Digest of Technical Papers 2: 32-33.

*Primary Examiner* — Melissa Koval
*Assistant Examiner* — Felicia Farrow
(74) *Attorney, Agent, or Firm* — Robert Platt Bell; Steven Lin (57) ABSTRACT

In one embodiment a heating mechanism is provided with an integrated circuit for testing and calibration purposes. During production testing, heating elements may be activated in order to quickly bring an integrated circuit up to operating temperature for temperature testing or calibration. Once the operating test temperature has been reached, the circuit can be quickly and easily tested to show it is operable within the design temperature range and/or to obtain calibration data to correct for temperature drift. Calibration data may be used to create correction data, which may be stored within the integrated circuit. During normal operation, the correction data may be used to compensate for variations in operation due to temperature.

23 Claims, 8 Drawing Sheets

(56) References Cited

U.S. PATENT DOCUMENTS

| | | |
|---|---|---|
| 8,426,924 B2 * | 4/2013 | Jwalant et al. .............. 257/379 |
| 2003/0034851 A1 * | 2/2003 | Norman et al. .............. 331/66 |
| 2004/0140826 A1 * | 7/2004 | Asam et al. .............. 324/760 |
| 2006/0012446 A1 * | 1/2006 | Hardy et al. .............. 331/176 |
| 2007/0115032 A1 * | 5/2007 | McClure et al. .............. 327/78 |
| 2008/0186002 A1 * | 8/2008 | Singh et al. .............. 323/234 |
| 2012/0169413 A1 * | 7/2012 | Choi .............. 327/539 |
| 2013/0162341 A1 * | 6/2013 | Temkine et al. .............. 327/539 |
| 2013/0264610 A1 * | 10/2013 | Chen et al. .............. 257/252 |

* cited by examiner

BANDGAP WITH THERMAL DRIFT CORRECTION

CROSS-REFERENCE TO RELATED APPLICATIONS

The present application claims priority from Provisional U.S. Patent Application No. 61/677,503, filed on Jul. 31, 2012, and incorporated herein by reference.

FIELD OF THE INVENTION

The present disclosure relates to the field of integrated circuits and testing. In particular, the present disclosure relates to a technique for including heating elements into an integrated circuit to facilitate testing and calibration at various temperatures, during the manufacturing process.

BACKGROUND

In the semiconductor manufacturing art, integrated circuits (IC's) may be constructed and tested and the resulting yield of semiconductor circuits fall within a distribution curve of performance characteristics. For example, a number of IC's may operate up to a particular clock speed without significant error, while other IC's, from the same manufacturing batch, may operate only at lower clock speeds, without significant error. Small variations in the size and shape of various semiconductor structures in the IC may alter how the IC performs at various clock speeds and temperatures. In the prior art, if an IC tested cannot perform at a given clock speed, it may have been marketed as capable of a lower clock speed, and thus reduce scrappage rates.

However, IC's may need to operate both within an acceptable limit of temperature as well as clock speed. As temperature increases, an IC may operate in a different manner, cease to operate reliably, or cease to operate at all. An IC manufacturer may need to certify that its products are capable of operating within a predetermined temperature range, and each IC may need to be tested to insure that the device actually meets the temperature range specification. As with clock speed, operating temperature range for an individual IC within a batch may vary, due to manufacturing tolerances and the like. Thus, it may be necessary to test each IC for compliance with temperature design characteristics.

Another concern with IC design and testing is that many IC's require accurate voltage references, in order to operate with precision. Analog-to-digital converters, for example, require a precise voltage reference Vref, to compare with an input signal. This voltage reference Vref should not drift with temperature, or if it does, such drift needs to be corrected or compensated. For precision analog-to-digital converters a voltage reference known as a bandgap voltage reference may be employed. A bandgap voltage reference is a largely temperature independent voltage reference circuit widely used in integrated circuits, usually with an output voltage around 1.25 V. This circuit concept was published by David Hilbiber in 1964. (See, e.g., Hilbiber, D. F. (1964), "A new semiconductor voltage standard", 1964 International Solid-State Circuits Conference: Digest of Technical Papers 2: 32-33, incorporated herein by reference).

Figure 1:
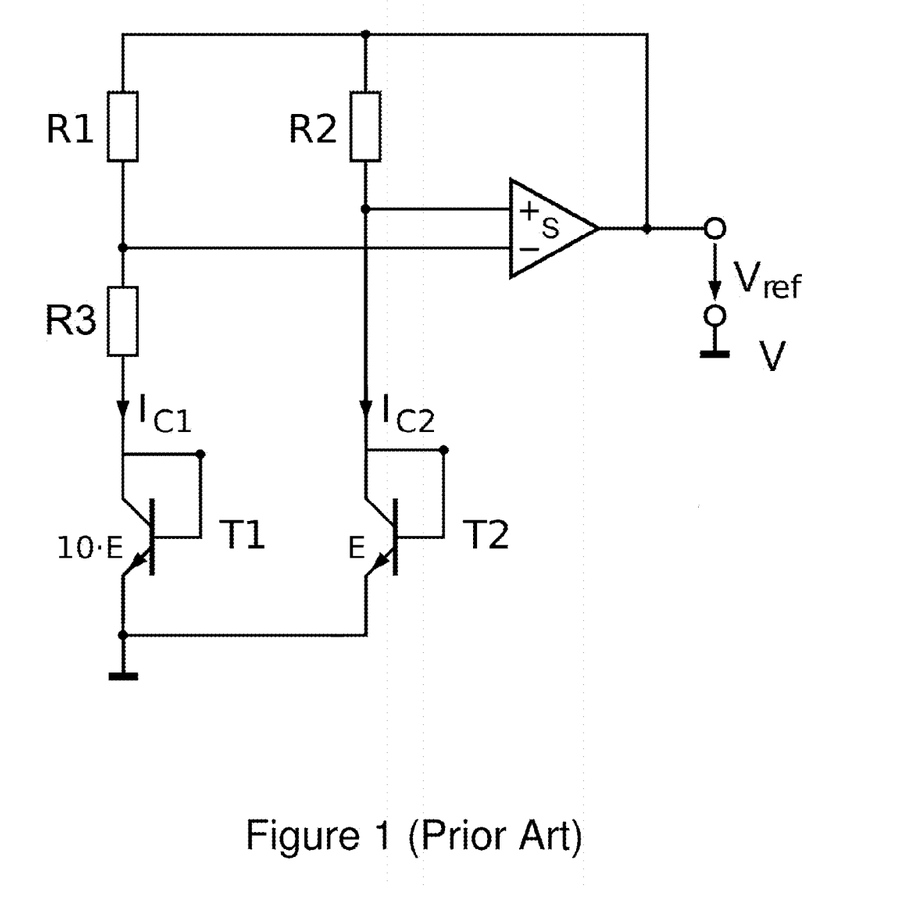
FIG. 1 is a schematic of a typical prior art bandgap voltage reference, provided for purposes of illustration.

FIG. 1 is a schematic of a typical bandgap voltage reference, provided for purposes of illustration. The voltage difference between two p-n junctions (e.g. transistors T1, T2), operated at different current densities (10E, E) is determined in adder S, and the output is the voltage reference Vref. The resulting voltage is about 1.2-1.3 V, depending on the particular technology and circuit design. The remaining voltage change over the operating temperature of typical integrated circuits is on the order of a few millivolts. This temperature dependency has a typical parabolic behavior, as will be illustrated below.

While a bandgap voltage reference may be very accurate and largely insensitive to temperature changes, for high-precision applications or applications where small voltages are measured, even this variation of a few millivolts may not be acceptable. In order to compensate for this slight variation with temperature, a temperature compensation correction may be added to the output of the bandgap voltage reference, (or may be corrected further downstream in the circuit) to correct for temperature drift. Typically, a correction curve may be plotted, using a minimum of three reference points needed to define the correction curve.

However, applying a standard correction curve to a bandgap voltage reference may not provide accurate temperature compensation, as each IC in a batch may have slightly different characteristics. Thus, it may be necessary to test each IC at various temperature points and obtain data to generate a temperature correction curve for the individual IC. This temperature curve may then be programmed into the device, for example in a one-time programmable (OTP) IC.

In the prior art, the technique for temperature-testing such IC's was slow and cumbersome. An individual IC would be placed in an oven or other type of heating device and temperature slowly raised and the functionality of the IC verified, or in the case of a bandgap voltage reference, temperature compensation data recorded. For initial design and prototyping, such slow and cumbersome techniques were acceptable in determining the overall design characteristics of the IC. However, for production testing—where large quantities of IC's need to be tested for temperature tolerance en masse, such techniques are not as workable, as the time required for testing is too long. In production testing, a test cycle on the order of seconds may be desirable.

For production calibration purposes, the techniques of the prior art have significant room for improvement. Heating an IC to a desired temperature point and waiting for the temperature to stabilize at that point (i.e., "stair stepping") might take on the order of 1.5 to 2 seconds or more, per data point. Thus, each point in the calibration curve may take a second or two to obtain. If three points are required (at minimum) to define the calibration curve, then it may take six seconds or more to obtain the calibration curve for a production part. In production high-speed testing circumstances, such a delay is usually not acceptable, as other tests also need to be performed on the IC.

If an external heat source is used to ramp up the temperature of the IC at the tester then the heat source will also heat up the test socket and other IC's (or subsequent IC's) on the test board. There would need to be an additional time allocated to bring the board and test setup temperature to nominal value before testing the next IC. This adds a significant amount of time to the total test time, which is not acceptable for production testing. Moreover, most production testers do not have such heating capabilities, likely because of these concerns.

A need exists in the art to provide an improved technique for testing IC's at various temperature points, both quickly and inexpensively, in order to allow for each IC in production to be tested and/or calibrated.

SUMMARY

Certain embodiments of this disclosure address problems of the prior art by providing a heating mechanism within the IC itself, for testing purposes. In addition, rather than heating the IC to discrete temperature points and allowing temperature to stabilize before taking readings, a bandgap with thermal drift correction technique can take voltage readings "on the fly" as temperature is ramped up, with little, if any, stair-stepping. During production testing, these heating elements may be activated in order to quickly and accurately bring the IC up to operating temperature for temperature testing or calibration. As the IC is heated to a desired temperature testing range, the circuit can be quickly and easily tested to show it is operable within the design temperature range and/or to obtain calibration data to correct for temperature drift. The IC may also be heated over time in a generally linear manner, and data points collected as the temperature is ramping up. These data points may be used to define a higher resolution calibration curve, and that information may then be used to calibrate the IC.

Note that while certain embodiments involving bandgap with thermal drift correction are disclosed in terms of manufacturing and testing a device having a bandgap voltage reference, the techniques of this disclosure may be applied to other types of devices as well. For example, gain drift of an analog-to-digital converter (ADC) or digital-to-analog converter (DAC) may be compensated. Or, an Oscillator (whose frequency drifts with temperature) may be temperature-corrected using the techniques of the present disclosure. The use of internal heaters may be applied to other types of integrated circuits in order to validate performance at design temperature ranges, reducing or eliminating the need for external heaters in the test device.

In addition, the use of internal heating elements may accelerate such testing, as the device under test will reach operating temperature and a desired temperature range more quickly and accurately than with prior art techniques. Heat is trapped inside the IC package and enables a rapid rise of temperature, without heating the testing device itself. External heating techniques, even if practical, would require cooling of the tester between tests. An external on-board heater would potentially heat up the socket and other board fixtures of the testing device, which would not only slow down the rate of rise of temperature but also will raise the ambient temperature for the next IC, unless the testing device was cooled between tests, which as noted previously would add a significant amount of time to the total test time making the approach less viable.

Bandgap with thermal drift correction embodiments have particular application to a device under test (DUT), where the value of the reference voltage Vref is critical to the operation of the device. The DUT should be able to produce a consistent Vref voltage level, within the operating temperature range of the DUT. Thus, one goal of certain bandgap with thermal drift correction embodiments is to measure Vref with respect to temperature, at the tester, and digitally correct the output of an analog-to-digital converter (ADC) to compensate for the Vref drift. The testing device, by itself, may not have the capability to sweep the entire design temperature range of the DUT, or at least not be able to do so in a time-effective manner. Embodiments described here address this problem by, in part, providing the DUT with self-heating capabilities.

In a traditional stair-step approach, where the IC is heating to a particular temperature and then settled prior to measuring data points, preliminary thermal modeling of the IC and measurements made on existing IC's suggests that the thermal time constant of an IC is in the order of 1.5 Seconds. Hence, to get a three-point measurement of Vref using a typical stair-step approach, one may need at least 4.5 seconds of test time, which may make this approach unviable. According to certain embodiments here, this scenario may be addressed by heating the Silicon using self-heating networks built into the IC and then take the Vref measurements as the temperature ramps up. The heating network heats up the bandgap and temperature sensor circuitry and raises its temperature from ambient to a high temperature (e.g., 100 degrees C. in one embodiment and any number of other temperatures suitable for testing, as understood by one having ordinary skill in the art) in a reasonable amount of time (e.g., 1 second in one embodiment and any other suitable time range for testing, as understood by one having ordinary skill in the art), which makes automated testing at maximum design temperature during production more feasible.

The heating network may comprise one or more of a number of rail clamp transistors (RCT clamps) which are transistors located on the chip which, when activated, conduct from the Vcc or "rail" voltage (power supply voltage) to ground. These transistors serve no other function than to generate heat by shunting power supply voltage directly to ground. Other devices may be used, including metal resistors, N-well (and/or deep N-well) resistors, P+ resistors and N+ resistors. The location of the heating network is engineered in such a way that the bandgap and temperature sensor experiences a linear ramp of temperature gradient. If the heating elements are located too close to the bandgap circuit (or other circuit under test) the device may heat too rapidly, which may prevent valid logging of temperature data. A step gradient might lead to loss of information. Output from a temperature sensor on the IC (which may comprise a monitored Vbe temperature of a BJT on the IC) may be used to signal the tester to capture the Vref voltages at pre-defined temperature points.

The measured Vref voltage along with the temperature may be used to predict the temperature coefficient of Vref. The testing device (Tester) records the instantaneous Vref and the instantaneous temperature of the DUT. An on-chip temperature sensor is used to measure the instantaneous temperature of the DUT. This voltage and temperature data may then be used to predict the temperature coefficient of Vref.

A polynomial fit may be employed to predict the variation of Vref with temperature. The predicted curvature can be used to digitally fix the output of the analog-to-digital converters, digital-to-analog converters, and other circuits that use this Vref voltage reference, thereby digitally correcting the curvature of bandgap.

In addition this self-heating test may also be used to search for bad parts. An IC may be heated using the self-heating elements, to maximum operating temperature, and the performance of the IC validated. If the IC fails to operate properly at the maximum design temperature, the IC may be rejected, or certified only to operate to a lower temperature. Also, instead of a ramping up the internal temperature, using the local heaters, one may also generate a staircase temperature profile. This may allow the temperature of the IC to attain a steady state on every step of the stair case profile. The stair-step approach may be used to capture the steady state Vref and may be used to predict the curvature of Vref.

In one embodiment, an integrated circuit may include at least one component whose operation varies with temperature. The integrated circuit further may include at least one heating element, located on the integrated circuit, configured to heat the integrated circuit. A temperature measuring device may be configured to operate in at least a test mode and a run mode. The temperature measuring device may generate a temperature signal for temperature calibration when in test mode and for temperature compensation when in run mode. A memory may be configured to receive temperature compensation data in the test mode and may be configured to output temperature correction data in the run mode.

A temperature correction circuit may be coupled to the temperature measuring device and the memory and may be configured to receive temperature data from the temperature measuring device and temperature correction data from the memory when in the run mode, and may be configured to correct operation of the at least one component whose operation varies with temperature in response to the temperature data and temperature correction data.

The at least one heating element may comprise a plurality of rail clamp transistors located around a periphery of the integrated circuit. The plurality of rail clamp transistors may be configured to activate in the test mode in response to a test code input to the integrated circuit, to selectively and controllably heat the integrated circuit.

In one embodiment, the temperature sensor may comprise at least one bipolar junction transistor and the temperature signal may comprise a voltage between a base and emitter of the bipolar junction transistor. The integrated circuit may include a bandgap voltage reference, configured to output a voltage signal Vref which varies with temperature. The temperature correction circuit may be configured to receive temperature data from the temperature measuring device and temperature correction data from the memory when in the run mode, and may be configured to correct the voltage signal Vref from the bandgap voltage reference in response to the temperature data and temperature correction data.

In one embodiment, the integrated circuit may include an oscillator configured to output an oscillating signal having a reference frequency f which varies with temperature. The temperature correction circuit may be configured to receive temperature data from the temperature measuring device and temperature correction data from the memory when in the run mode, and may be configured to correct the reference frequency f from the oscillator in response to the temperature data and temperature correction data.

In one embodiment, the integrated circuit includes an analog-to-digital converter having a gain g which varies with temperature. The temperature correction circuit may be configured to receive temperature data from the temperature measuring device and temperature correction data from the memory when in the run mode, and may be configured to correct the gain g of the analog-to-digital converter in response to the temperature data and temperature correction data.

In one embodiment, the integrated circuit includes a digital-to-analog converter having a gain g which varies with temperature. The temperature correction circuit may be configured to receive temperature data from the temperature measuring device and temperature correction data from the memory when in the run mode, and may be configured to correct the gain g of the digital-to-analog converter in response to the temperature data and temperature correction data.

In one embodiment, the temperature measuring device may include a first temperature sensing device configured to output a temperature signal in both a test mode and a second temperature measuring device configured to operate in a run mode.

In one embodiment, the temperature measuring device may include a single temperature measurement device configured to output a temperature signal in both the test mode and the run mode.

In one embodiment, the temperature measuring device may generate a temperature signal external to the integrated circuit for temperature calibration when in test mode and internally within the integrated circuit for temperature correction when in run mode.

In one embodiment, an integrated circuit may be formed on a semiconductor substrate and may have at least one component whose operation varies with temperature. At least one testing heating element may be formed on the semiconductor substrate configured to heat the semiconductor device through a temperature range during an initial testing period. A memory may be configured to store temperature and operation data from the initial testing period to correct operation of the at least one component whose operation varies with temperature, during a later run period.

In one embodiment, a temperature sensor on the semiconductor device may be configured to monitor temperature of the semiconductor device. In one embodiment, the integrated circuit may include a bandgap voltage reference. In one embodiment, the at least one heating element may be configured to heat the integrated circuit through a range of temperature values such that voltage from the bandgap voltage reference may be measured at a plurality of discrete temperature values to produce a plurality of voltage values.

In one embodiment, the memory may be configured to store digital correction data representing a voltage calibration curve generated from the plurality of voltage values. The integrated circuit may be configured to apply the digital correction data stored in the memory and may be configured to correct operation of the integrated circuit to compensate for variations in the reference voltage signal from the bandgap voltage reference.

In one embodiment, the integrated circuit may generate a voltage correction curve for the bandgap voltage reference to and may apply the voltage correction curve to the reference voltage from the bandgap voltage reference to correct analog output of the bandgap voltage reference. In one embodiment, the digital correction data comprises coefficients of a predetermined polynomial of a predetermined order.

In one embodiment, the at least one heating element may include one or more of a rail clamp transistor, metal resistor, N-well resistor, deep N-well resistor, P+ resistor, and N+ resistor.

In one embodiment, a method of correcting operation of an integrated circuit for temperature drift is provided where the integrated circuit may include at least one heating element. The integrated circuit may have a test mode for logging temperature and operation data in response to heating of the integrated circuit by the at least one heating element. Temperature correction data may be retrieved from a memory element in the integrated circuit. The temperature correction data may be previously stored during the test mode in response to logged temperature and operation data. The operation of the integrated circuit may be corrected in response to the temperature correction data stored in the memory element.

In one embodiment, a temperature sensor may sense temperature of the integrated circuit, and temperature correction data corresponding to the temperature measured by the temperature sensor may be retrieved from the memory element in the integrated circuit. Output voltage of a bandgap voltage reference may be corrected within the integrated circuit in response to temperature measured by the temperature sensor by applying temperature correction data from the memory element corresponding to the temperature measured by the temperature sensor.

In one embodiment, the integrated circuit may be heated using at least one heating element to a range of temperature values. The integrated circuit may then be tested at a temperature value by measuring voltage from the bandgap voltage reference within the range of temperature values to produce a plurality of voltage values.

In one embodiment, correcting operation of the integrated circuit may include receiving temperature data from the temperature sensor, retrieving temperature correction data from the memory element when in the run mode, and correcting a reference frequency f from an oscillator within the integrated circuit, in response to the temperature data and temperature correction data.

In one embodiment, correcting operation of the integrated circuit may include receiving temperature correction data from the temperature sensor, retrieving temperature correction data from the memory element when in the run mode, and correcting the gain g of the analog-to-digital converter in response to the temperature data and temperature correction data.

In one embodiment, correcting operation of the integrated circuit may include receiving temperature data from the temperature sensor, retrieving temperature correction data from the memory element when in the run mode, and correcting the gain g of the digital-to-analog converter in response to the temperature data and temperature correction data.

DETAILED DESCRIPTION

Figure 2:
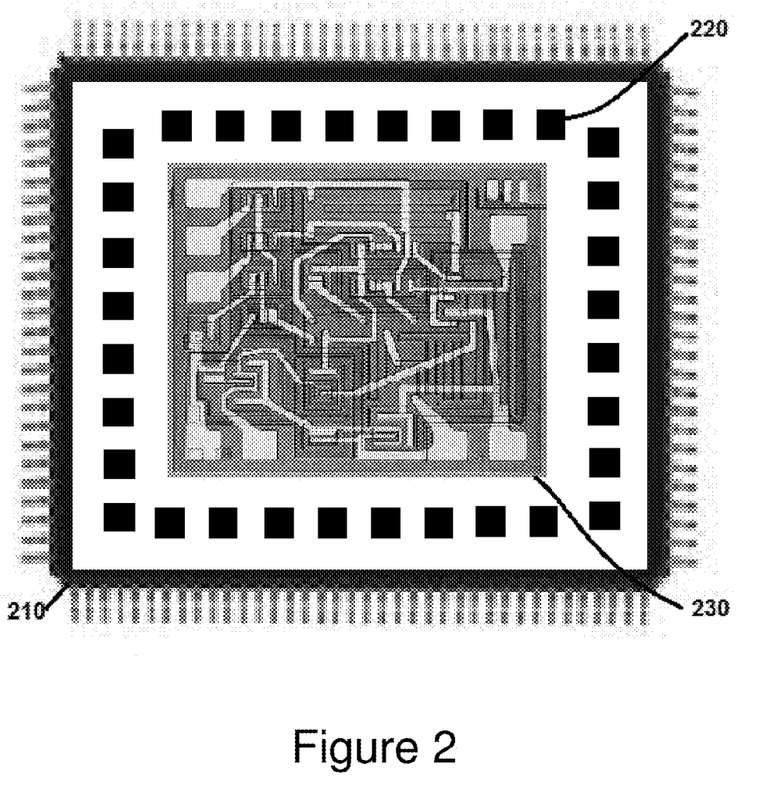
FIG. 2 is a diagram illustrating heating elements located within a semiconductor device, according to embodiments of this disclosure.

FIG. 2 is a diagram illustrating heating elements 220 located within a semiconductor device 210. Semiconductor device (IC) 210 may include an integrated analog and/or digital circuit 230 formed on a semiconductor substrate, as is known in the art. Integrated analog and/or digital circuit 230 may include components or circuit elements whose performance may vary with temperature. In one embodiment, integrated analog and/or digital circuit may include a bandgap voltage reference whose output voltage varies with temperature. In one embodiment, integrated analog and/or digital circuit may include an oscillator whose frequency varies with temperature. In one embodiment, integrated analog and/or digital circuit may include and analog-to-digital converter and/or a digital-to-analog converter whose gain varies with temperature. Integrated analog and/or digital circuit 230 may also include a temperature sensor, which is described in more detail below in connection with FIG. 8. The temperature sensor may comprise a bipolar junction transistor within the integrated analog and/or digital circuit 230, and temperature may be monitored by measuring the voltage between base and emitter on the bipolar junction transistor. Other types of temperature sensors, such as a resistor having a known temperature coefficient, may be formed on the chip as are known to one of ordinary skill in the art.

As described in more detail herein, IC 210 may be operated in two modes, collectively referred to herein for the purposes of brevity as "test mode" and "run mode". The term "test mode" as used in the present disclosure, refers to a testing or calibration period, usually (but not exclusively) performed during the manufacturing process of IC 210, specifically near the end of the manufacturing process of IC 210, where IC 210 may be tested to prove functionality, or as set forth in the present disclosure, to calibrate to compensate for temperature effects. The term "run mode" as used in the present disclosure, refers to the generally normal operation of IC 210 for its intended field of use, for example, as operated by an end user. As will be described in more detail below, the run mode of operation makes use of the calibration data measured and stored during the test mode of operation, in order to correct the operation of IC 210 to compensate for temperature effects.

Heating elements, 220 may be located around the periphery of IC 210, on the same semiconductor substrate, as part of the overall circuit design, in order to heat the device when under test. Heating elements 220 may not be utilized when the device is in service (e.g., run mode), and thus may be reserved only for testing and calibration purposes (e.g., test mode). In other embodiments, heating elements may be arranged differently, on different area(s) relative to IC 210. For example, more or fewer elements may be used, and their pattern may reflect a desired heating pattern or arrangement, which may be customized for particular IC's in different embodiments.

The heating network may comprise one or more of a number of rail clamp transistors (RCT clamps) which are transistors located on the chip which, when activated, conduct from the Vcc or "rail" voltage (power supply voltage) to ground. These transistors can be used such that they serve no other function than to generate heat by shunting power supply voltage directly to ground during a testing or calibration phase (test mode) of IC 210. Other heating devices may be used, including but not limited to metal resistors, N-well (and/or deep N-well) resistors, P+ resistors and N+ resistors. The location of the heating network 220 may be engineered in such a way that integrated analog and/or digital circuit 230 may experience a substantially linear ramp of temperature gradient. If the heating elements 220 are located too close to integrated analog and/or digital circuit 230 the IC 210 may heat too rapidly, which may prevent logging of valid temperature data.

Thus, for example, if the heating elements 220 are placed too closely to a circuit under test (e.g., bandgap circuit) within integrated analog and/or digital circuit 230, the circuit under test may heat too rapidly to obtain temperature data in an orderly manner. The location and number of heating elements 220 may be determined empirically, or by thermal modeling of the system. For example, heating elements 220 may be added to a device (or selectively activated) in the prototype testing stage to determine the number and location of heating elements required for a particular IC, for a desired temperature curve. Thermal modeling using computer models may also be used to determine the number and location of heating elements on the IC.

To prevent accidental activation of heating elements 220 by an end user during run mode, activation of heating elements 220 may be restricted in a number of ways. For example, heating elements 220 may be activated only by setting a number of registers to certain values, which are not defined and disclosed in the product literature (e.g., a so-called Easter-egg feature). Alternately, after testing is completed (test mode), heating elements 220 may be isolated from the rest of the IC by intentionally blowing a fusible link or the like on the circuit. Heating elements 220 may consume power on the order of one watt or more, which on an IC that generally draws only milliwatts of power, is relatively large. As a result, it may be desirable to prevent an end user from accidentally activating the heating elements once the IC is in general use (run mode).

As heating elements 220 may be located within the integrated circuit, the effect of these heating elements, on the operation of the IC may be rapid. As a result, the IC may reach a desired testing temperature quickly and accurately, and testing of individual IC's, at particular temperature points or ranges, can be performed in a short amount of time, making the testing process more practical for production processes.

FIGS. 3-6 are graphs illustrating experimental results of embodiments involving bandgap with thermal drift correction as applied to an actual IC. The graphs illustrated in FIGS. 3-6 are from one of a number of actual sampled integrated circuits, which includes a bandgap voltage reference as well as a built-in temperature monitoring circuit. This actual sampled part was also provided with built-in heating elements as described previously. In all the data presented in FIGS. 3-6, a 1.5 second measurement window was used.

In this sampled part, RCT clamps were engaged to heat up the silicon. As illustrated in FIG. 2, the RCT clamps 220 may be located in the semiconductor device, around the periphery of the IC. Since the semiconductor device (IC) is encapsulated, heat from the RCT clamps rapidly heats in the interior of the IC more effectively than externally applied heat. The delta-Vbe (change in voltage) output of a bipolar junction transistor within integrated analog and/or digital circuit, which acts as a temperature sensor, was used to calculate temperature of the IC.

Figure 3:
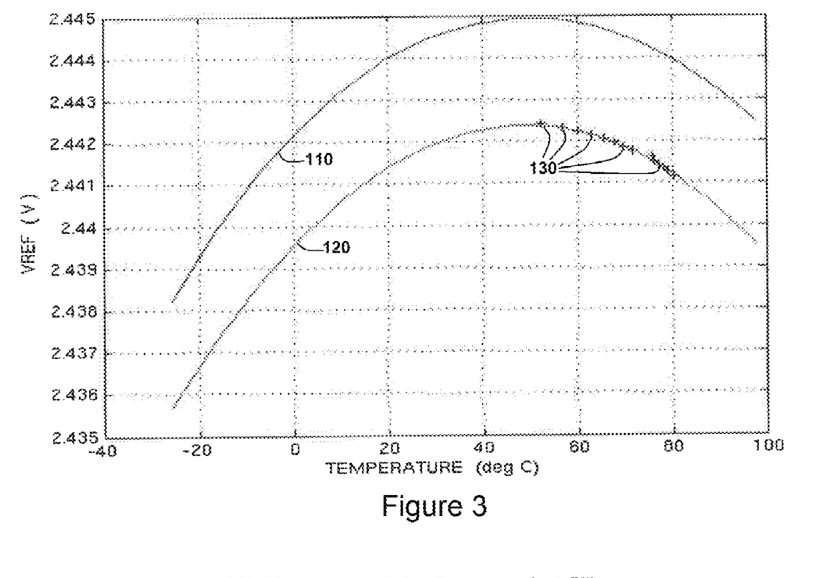
FIG. 3 is a graph illustrating Vref as predicted, plotted with temperature, for a particular test part.

FIG. 3 is a graph illustrating Vref as characterized, and Vref as predicted, plotted with temperature, for a particular test part. The Y-axis represents the output voltage Vref, while the X-axis represents temperature in degrees C. In FIG. 3, curve 110 represents the steady state characterized Vref, illustrating the parabolic nature of a bandgap Vref, with temperature, as discussed previously in the Background section. This characterization illustrates the generally parabolic response in Vref relative to temperature. Curve 120 represents a predicted Vref value based on actual data points 130 obtained during the test procedure. The data points 130 may be used to generate curve 120, which provides an acceptably accurate compensation for Vref with regard to temperature, as characterized by line 110. In a one-time programmable IC used in one embodiment, data which represents curve 120 may be burned to the IC to provide a more accurate temperature compensation curve for Vref, which may be useful in a highly accurate analog-to-digital converter or the like, as described in more detail below in connection with FIGS. 8 and 9.

Figure 4:
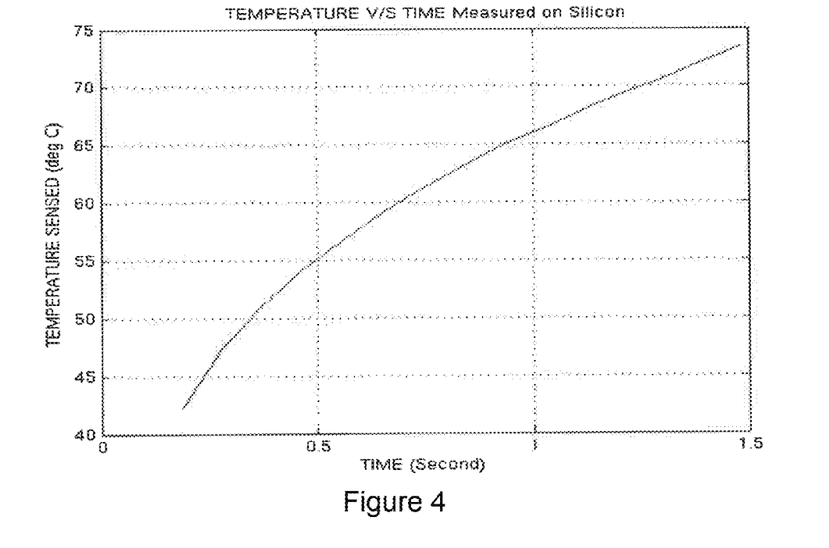
FIG. 4 is a graph illustrating time versus temperature, showing how internal heater(s) can quickly raise the temperature level of an IC for testing purposes.

FIG. 4 is a graph illustrating time versus temperature, showing how internal heater(s) can quickly raise the temperature level of an IC for testing purposes. In FIG. 4, the Y-axis represents temperature sensed (using an on-board temperature sensor on the IC) and the X-axis represents time, in seconds. As illustrated in FIG. 4, the IC can be heated from 45 degC to over 70 degC in a little over a second, which reflects the temperature range used to obtain sample points in FIG. 3. By reducing the amount of time needed to heat the IC to a given temperature, in a controlled manner, embodiments of this disclosure allow an IC to be tested and calibrated in a time-efficient manner suitable for mass-production of integrated circuit devices.

The prior art technique of heating using external heating elements, as noted previously, could take on the order of three or more seconds, which in a production test environment, may not be acceptable. Such a technique would also heat up the test socket holding the IC, as well as other board hardware, requiring additional test time and hardware needs to be allocated to bring the test hardware back to room temperature.

Figure 5:
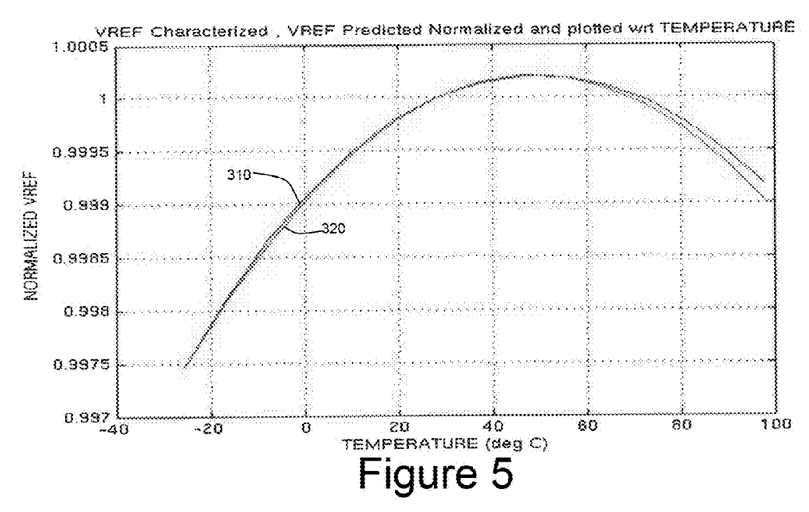
FIG. 5 is a graph illustrating normalized Vref relative to temperature.

FIG. 5 is a graph illustrating normalized Vref relative to temperature. In the graph of FIG. 5, the Y-axis represents the voltage Vref voltage normalized to 1 at 25 C—a typical system gain calibration temperature—while the X-axis represents temperature. Line 310 represents the steady characterized Vref normalized to 1 at 25 degreesC. Line 320 represents the predicted Vref (based on data points collected at the tester) normalized to 1 at 25 degreesC. The relationship between the predicted Vref and its normalized value may be determined using the following equations.

The temperature coefficient for Vref, relative to temperature in degrees C., may be represented by equation (1) where the absolute value is taken of the value for Vref(T) minus Vref(25) (a typical gain calibration temperature) divided by Vref(25) times T−25.

$$TempCo = \left\|\frac{Vref(T) - Vref(25)}{Vref(25)*(T-25)}\right\| \quad (1)$$

The corrected temperature coefficient may be calculated according to equation (2), where the corrected temperature coefficient is equal to the absolute value of the normalized Vref for a predicted temperature T, minus the normalized Vref at 25 degrees C., divided by the normalized Vref at 25 degrees C. times T minus 25:

$$CorrectedTempCo = \left\|\frac{\text{Norm} \cdot Vref_{predicted(T)} - \text{Norm} \cdot Vref(25)}{\text{Norm} \cdot Vref(25)*(T-25)}\right\| \quad (2)$$

Normalized Vref can then be calculated according to equation (3), where the normalized Vref is the absolute value of Vref at temperature T divided by Vref at 25 degrees C.:

$$\text{Norm} \cdot Vref = \left\|\frac{Vref(T)}{Vref(25)}\right\| \quad (3)$$

Figure 6:
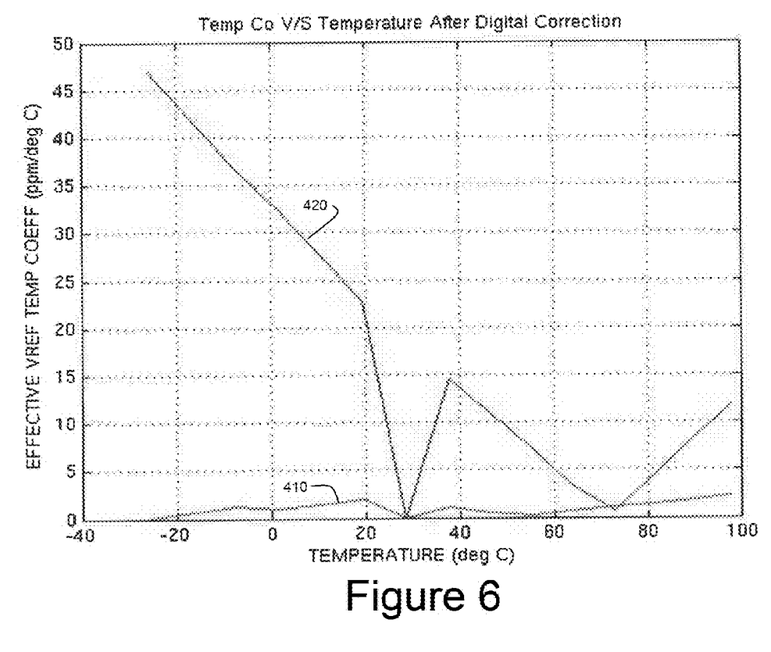
FIG. 6 illustrates the effective Vref coefficient correction based on the data in FIGS. 3-5.

FIG. 6 illustrates the effective Vref coefficient based on the data in FIGS. 3 and 4-5. In FIG. 6, the X-axis represents temperature in degrees C. The Y-axis represents the effective Vref coefficient in ppm/degrees C. Line 420 represents the actual temperature coefficient before correction, while line 401 represents the corrected temperature coefficient. As illustrated in FIG. 6, correction coefficient is reduced to well below 5 ppm/degree C. Note how both lines trend toward zero at the 25 degree C. mark, which is the normalized gain calibration point for the IC.

From the data in FIG. 3, data representing a correction curve may be programmed into the device, unique to that device, such that the output of the bandgap reference voltage Vref is corrected, regardless of temperature of the device, as described in more detail in connection with FIGS. 7-10. This temperature correction curve makes the highly accurate bandgap voltage reference even more precise, which allows for precision application of the bandgap in applications such as A/D converters and the like, where a precision voltage reference is required, which is also temperature independent.

As noted previously, the heating elements of the device may also be used to test circuits to insure valid operation at design temperature limits. In addition, the techniques illustrated herein may be applied in other ways. For example, the heating devices may be employed in normal operation to maintain a circuit at a predetermined temperature, and thus insure consistent operation of the bandgap or other circuit device.

Figure 7:
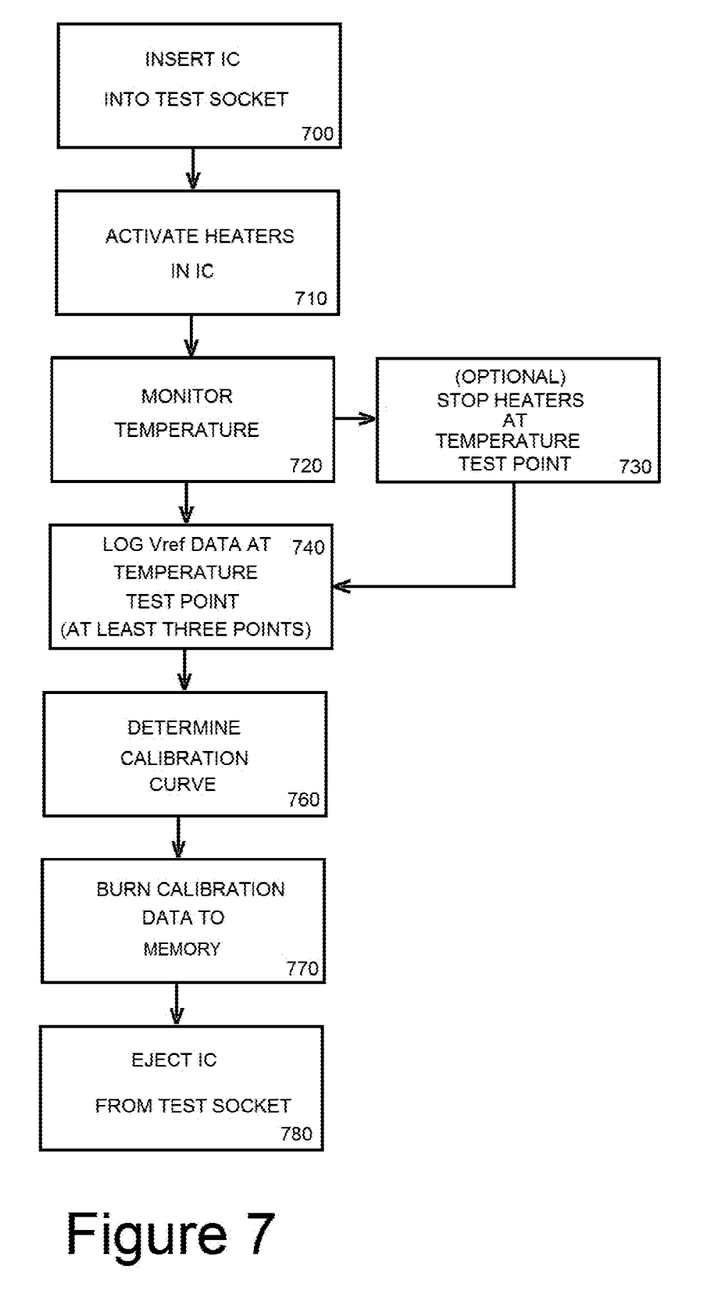
FIG. 7 illustrates example steps in a testing and calibration process (test mode), according to embodiments of this disclosure.

FIG. 7 illustrates example steps in a testing and calibration process according to one embodiment. Referring to FIG. 7, in step 700, an integrated circuit (IC) such as an IC including a bandgap reference or other circuit requiring temperature calibration and compensation, is inserted into a test socket or other testing type device (e.g., bed of nails tester or the like). In step 710, heating elements (e.g., heating elements around the periphery of the IC as illustrated in FIG. 2) are then activated. To prevent accidental activation of the heating elements by an end user, activation of the heating elements may be restricted in a number of ways. For example, the elements may be activated only by setting a number of registers to certain values, which are not defined and disclosed in the product literature (e.g., a so-called Easter-egg feature). Alternately, after testing is completed, the heating elements may be isolated from the rest of the IC by intentionally blowing a fusible link or the like on the circuit. Heating elements may consume power on the order of one watt or more, which on an IC that generally draws only milliwatts of power, is relatively large. As a result, it may be desirable to prevent an end user from accidentally activating the heating elements once the IC is in general use.

In step 720, temperature on the IC may be monitored by the testing device. Temperature may be monitored by measuring the Vbe voltage of a transistor on the IC, or using a designated temperature sensor built-in to the device for such a purpose. As the temperature ramps up, Vref data (or other data, depending on the circuit on the IC being tested/calibrated) may be logged in step 740.

In one embodiment, the temperature on the IC may be allowed to rise in a substantially linear fashion and Vref data captured "on the fly" rather than waiting for temperature to settle at a reference point. However, optionally, in step 730, heating elements may be momentarily switched off for a few milliseconds to allow temperature to stabilize at a particular point, momentarily, or for a longer period (seconds), if testing goals dictate (e.g., proving operation of an IC at temperature).

In some embodiments, logging of Vref data in step 740 may be repeated for three cycles or more, as illustrated in step 750. Three data points may be used in one embodiment, as three points define a curve. Since the parabolic nature of the Vref/temperature curve is known, fewer data points may be used in order to calibrate the device, if desired. Moreover, a fewer number of data points (e.g., two) may be used to calibrate circuits where temperature response is substantially linear, or even a single data point, for applications with limited temperature ranges.

In step 760, the calibration curve may be determined by using the logged Vref data and temperature data to produce a curve fitted to the temperature data, as illustrated previously in FIG. 3. This data may then be fitted (e.g., to a nth order polynomial where 'n' is a pre-determined order). The coefficients of the polynomial fit may then be programmed into a non-volatile memory in the IC, or otherwise stored such that the pertinent test-related data is available. The IC may then use the nth order polynomial and the programmed coefficients to, for example, correct the gain of an ADC across the operating temperature range. An on-chip temperature sensor may be used to measure the temperature of the IC when in normal operation, and that temperature data information may be used to compute a new gain of the ADC to compensate for temperature drift. Note that in this embodiment, the correction may all be in the digital stage. However, in other embodiments, other types of correction may be applied.

Once testing and calibration is complete, the IC may be ejected from a socket in step 780. Since the heating of the IC may be contained within the IC package itself, and since the test may be of short duration, little of this heat may transfer to the testing device itself. As a result, the testing device may remain cool and does not transfer heat to a subsequent IC tested. As noted previously, if external heaters were applied for such a test, the testing device would likely heat up with each subsequent use. Extensive cooling periods or cooling devices for the testing device would likely be required, which may not be practical given the time period allotted in semi-conductor production for testing.

Figure 8:
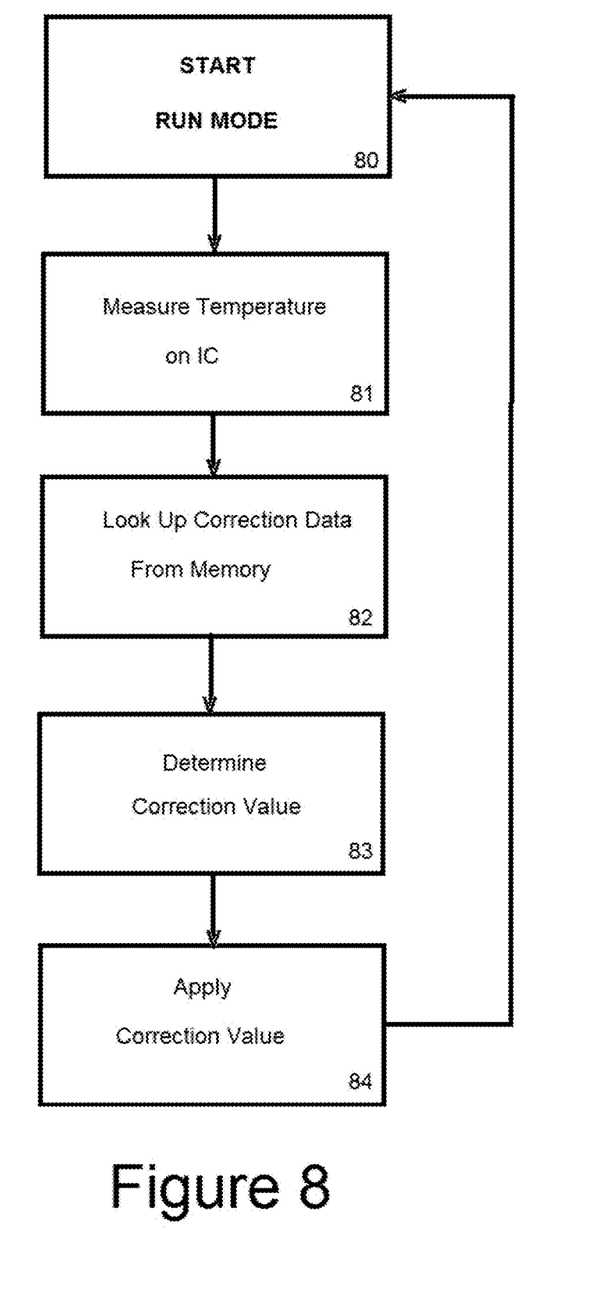
FIG. 8 illustrates example steps in the correction process (run mode) according to embodiments of this disclosure.

FIG. 8 illustrates example steps in the correction process (run mode) according to embodiments of this disclosure. Referring to FIG. 8, run mode commences when an IC is placed in normal operation or service, by the end user, as illustrated in nominal start step 80. Run mode may commence when the IC is powered-up, for example, outside of a test mode environment. In step 81, temperature of the IC is measured, either by the same temperature sensor used for calibration, or another sensor specifically for that purpose, as detailed below. In step 82, correction data is then obtained from stored memory on the IC. Depending on application, this correction data may comprise a look-up table of values, a number of correction coefficients defining a correction curve, or other data values. In step 82 a correction value is determined, either an analog correction value for an analog circuit, or a digital value to alter the operation of a digital component in the IC to compensate for changes in voltage, current, frequency, phase or the like, in the IC, as noted previously. In step 84, the correction value is applied to the circuit to compensate for changes in temperature, and thus correct operation of the IC accordingly.

Figure 9:
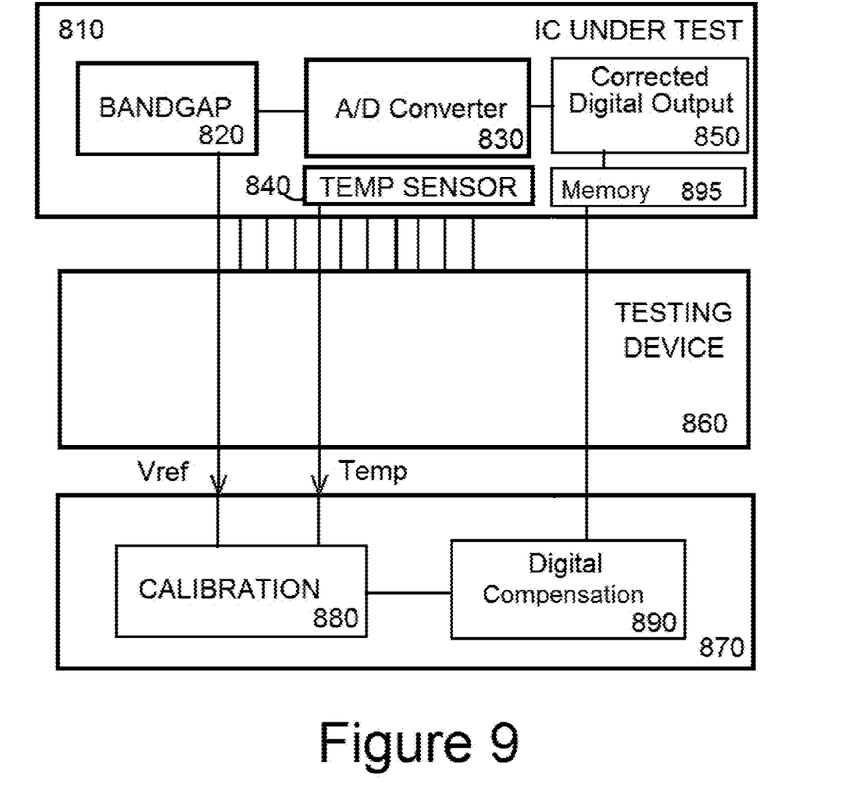
FIG. 9 is a block diagram of a testing apparatus illustrating a calibration procedure (test mode), according to embodiments of this disclosure.

FIG. 9 is a block diagram of an example testing apparatus illustrating a calibration procedure according to one embodiment. Integrated circuit under test 810 may include a bandgap voltage reference 820. For the purposes of illustration, the embodiment of FIG. 9 illustrates a bandgap voltage reference. However, it should be understood by one of ordinary skill in the art that other temperature-dependent circuitry may also be represented by elements 820 and/or 830 in FIG. 9, including but not limited to oscillators, A/D converters, and D/A converters, as well as other types of circuits where temperature correction may be desired.

Bandgap voltage reference 820 may output a reference voltage Vref, which passes through the testing device 860 to a processor 870 or the like, which logs the Vref data, as well as temperature data from temperature sensor 840, to produce a calibration curve 880. This data may then be fitted (e.g., to a nth order polynomial where 'n' is a pre-determined order), the fitting coefficients of which are shown as digital compensation data 890. The fitting coefficients (digital compensation data 890) may then be programmed into non-volatile memory 895 in the IC under test 810, or otherwise stored such that the test-related data is available. The IC 810 may then use, for example, the nth order polynomial and the programmed coefficients to correct the gain of the ADC 830 across the operating temperature range to produce a corrected digital output 850. The on-chip temperature sensor 840 may be used to measure the temperature of the IC under normal (run mode) operation, and that temperature information may be used to compute the new gain of the ADC 830 or perform other correcting functions as will be discussed in more detail.

Figure 10:
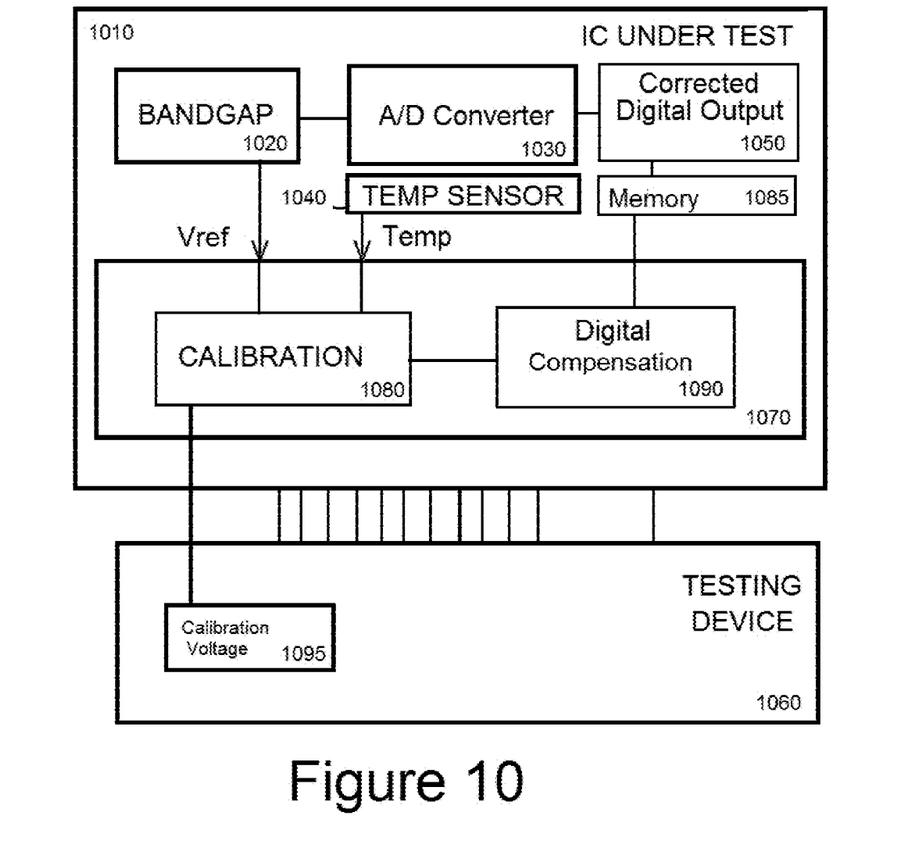
FIG. 10 is a block diagram of a testing apparatus illustrating a calibration procedure (test mode) using an on-board calibration technique according to embodiments of this disclosure.

FIG. 10 is a block diagram of a testing apparatus illustrating a calibration procedure (test mode) using an on-board calibration technique according to embodiments of this disclosure. In the embodiment of FIG. 9, the calibration procedure may be directed and controlled by the testing device 860 and processor 870. Such an embodiment may require that a production testing device 860 and processor be modified and/or programmed to perform the calibration (test mode) steps of, for example, FIG. 7. In other embodiments, however, it may be advantageous to incorporate these testing functions of test mode into the IC under test 1010, as illustrated in FIG. 10. In FIG. 10, testing device 1060 may be referred to as a "dumb tester" in that, in terms of the temperature calibration technique of the test mode of the present disclosure, only an accurate calibration voltage 1095 need be applied to the IC under test 1010.

Referring to FIG. 10, integrated circuit under test 1010 may include a bandgap voltage reference 1020. For the purposes of illustration, the embodiment of FIG. 10 illustrates a bandgap voltage reference 1020. However, it should be understood by one of ordinary skill in the art that other temperature-dependent circuitry may also be represented by elements 1020 and/or 1030 in FIG. 10, including but not limited to oscillators, A/D converters, and D/A converters, as well as other types of circuits where temperature correction may be desired.

Bandgap voltage reference 1020 may output a reference voltage Vref, which passes through the testing circuit 1070 on IC under test 1010, which logs the Vref data and compares the Vref data to an external calibration voltage 1095 from testing device 1060. The logged Vref data, as well as temperature data from temperature sensor 1040 is then used to produce a calibration curve 1080. This data may then be fitted (e.g., to a nth order polynomial where 'n' is a pre-determined order), the fitting coefficients of which are shown as digital compensation data 1090. The fitting coefficients (digital compensation data 1090) may then be programmed into non-volatile memory 1085 in the IC under test 1010, or otherwise stored such that the test-related data is available. The IC 1010 may then use, for example, the nth order polynomial and the programmed coefficients to correct the gain of the ADC 1030 across the operating temperature range to produce a corrected digital output 1050, or perform other correcting functions as will be discussed in more detail. The on-chip temperature sensor 1040 may be used to measure the temperature of the IC under normal (run mode) operation, and that temperature information may be used to compute the new gain of the ADC 1030.

In the embodiment of FIG. 10, the entire calibration sequence (test mode) may take place within IC under test 1010 itself. Substantially all that is required for IC 1010 to calibrate itself is an accurate calibration voltage 1095 with which to compare the measured Vref. As such, the testing device 1060 may comprise a standard IC tester, with little or no modification in order to implement the present calibration technique. Since the IC may be self-calibrating, it may be possible to calibrate such IC's in the field, for example, if they have been in storage and there is concern about temperature drift over time. Such an embodiment may have applications where critical electrical components are stockpiled and periodically replaced.

Correcting the output or operation of the IC (element 1010 in FIG. 10, 810 in FIG. 9, or 230 of FIG. 2) may be achieved using one or more techniques As used in the present disclosure, the term "correction" should be interpreted as encompassing one or more of these techniques. In the operating or "run mode" of an IC, these correction techniques, using data derived from the calibration or "test mode" may be applied to compensate for the effects of temperature on the operation of an IC. As illustrated in one embodiment, the IC may comprise a bandgap voltage reference, and correction may include altering the output analog voltage Vref, to correct for variations in temperature. The value of Vref may be altered using a voltage divider or other analog circuitry to compensate for temperature change, in accordance with the calibration data obtained during the test mode. In one embodiment, the output analog voltage Vref may be corrected at a digital stage, for example, at an analog-to-digital converter, to produce a corrected digital value for Vref. Correction may also include controlling subsequent circuitry "downstream" from the bandgap voltage reference in such a manner as to compensate for changes due to temperature, in accordance with the calibration data obtained during test mode. Current, rather than, or in addition to, voltage, may be similarly corrected.

Other types of circuits, including, but not limited to oscillators, analog-to-digital-converters, and digital-to-analog converters may be corrected in a similar manner. Oscillator frequency (or phase or time) may be corrected in run mode, with temperature, in response to calibration data obtained during test mode. Gain of an analog-to-digital converter, digital-to-analog converter, amplifier, or the like, may be corrected in run mode, with temperature, in response to calibration data obtained during test mode.

Temperature sensor 840 of FIGS. 9 and 1040 of FIG. 10 may comprise a single sensor, or multiple sensors, depending on application. In one embodiment, a separate temperature sensor may be applied to measure temperature of the IC during calibration (test mode) and a separate temperature sensor may be used to measure temperature during correction (run mode) of an IC. In another embodiment, the same temperature sensor or sensors may be used for both calibration (test mode) and for correction (run mode).

In addition, these temperature sensor(s) may be dedicated components on an IC (operating solely for the purpose of calibration and/or correction) or may comprise sensors utilized for other purposes on the IC (e.g., temperature monitoring of an IC for overheating conditions and the like) or may comprise components which are also utilized for other purposes. For example, voltage between base and emitter (Vbe) on one or more of the transistors T1 and T2 of FIG. 1, may be monitored to determine temperature of an IC, as Vbe may vary with temperature. Similarly, voltage drop across a resistor R1, R2, R3 may also be monitored to determine temperature.

While various embodiments have been disclosed and described in detail herein, it will be apparent to those having ordinary skill in the art that various changes in form, detail, design, and implementation may be made without departing from the spirit and scope of this disclosure and its appended claims.

We claim:

1. An integrated circuit having at least one component whose operation varies with temperature, the integrated circuit comprising:
- at least one heating element, located on the integrated circuit substrate as part of the integrated circuit, configured to heat the entire integrated circuit in a test mode and to remain off in a run mode;
- a temperature measuring device, located on the integrated circuit, configured to operate in at least the test mode and the run mode, the temperature measuring device configured to generate temperature data for temperature calibration when in the test mode and for temperature compensation when in the run mode;
- a memory configured to receive the temperature data and store temperature compensation data in the test mode and configured to receive the temperature data and output temperature correction data in the run mode,
- a temperature correction circuit coupled to the temperature measuring device and the memory, configured to receive temperature data from the temperature measuring device and temperature correction data from the memory when in the run mode, and configured to correct operation of the at least one component whose operation varies with temperature, in response to the temperature data and temperature correction data,
- wherein the at least one heating element comprises a plurality of rail clamp transistors located on a periphery of the integrated circuit substrate.

2. The integrated circuit of claim 1, wherein the plurality of rail clamp transistors located on the periphery of the integrated circuit substrate are configured to activate in the test mode in response to a test code input to the integrated circuit, to heat the integrated circuit.

3. The integrated circuit of claim 2, wherein the temperature measuring device comprises one bipolar junction transistor and the temperature signal comprises a voltage between a base and emitter of the bipolar junction transistor,
- wherein when the plurality of rail clamp transistors located on the periphery of the integrated circuit substrate are activated in the test mode in response to a test code input to the integrated circuit, the integrated circuit is continuously heated such that temperature of the integrated circuit increases, and temperature compensation data is stored in the memory at predetermined temperature points as the temperature of the integrated circuit increases.

4. The integrated circuit of claim 1, wherein the integrated circuit includes a bandgap voltage reference, configured to output a voltage signal Vref which varies with temperature, the temperature correction circuit configured to receive temperature data from the temperature measuring device and temperature correction data from the memory when in the run mode, and configured to digitally correct the voltage signal Vref from the bandgap voltage reference in response to the temperature data and temperature correction data.

5. The integrated circuit of claim 1, wherein the integrated circuit comprises an oscillator configured to output an oscillating signal having a reference frequency f which varies with temperature, the temperature correction circuit configured to receive temperature data from the temperature measuring device and temperature correction data from the memory when in the run mode, and configured to correct the reference frequency f from the oscillator in response to the temperature data and temperature correction data.

6. The integrated circuit of claim 1, wherein the integrated circuit comprises an analog-to-digital converter having a gain g which varies with temperature, the temperature correction circuit configured to receive temperature data from the temperature measuring device and temperature correction data from the memory when in the run mode, and configured to digitally correct the gain g of the analog-to-digital converter in response to the temperature data and temperature correction data.

7. The integrated circuit of claim 1, wherein the integrated circuit comprises a digital-to-analog converter having a gain g which varies with temperature, the temperature correction circuit configured to receive temperature data from the temperature measuring device and temperature correction data from the memory when in the run mode, and configured to digitally correct the gain g of the digital-to-analog converter in response to the temperature data and temperature correction data.

8. The integrated circuit of claim 1, wherein the temperature measuring device comprises a first temperature sensing device located on the integrated circuit, configured to output temperature data of the entire integrated circuit in a test mode and a second temperature measuring device located on the integrated circuit, configured to output temperature data of the entire integrated circuit in a run mode.

9. The integrated circuit of claim 1, wherein the temperature measuring device comprises a single temperature measurement device located on the integrated circuit, configured to output temperature data for the entire integrated circuit in both the test mode and the run mode.

10. The integrated circuit of claim 1, wherein the temperature measuring device located on the integrated circuit, is configured to output temperature data for the entire integrated circuit external to the integrated circuit for temperature calibration when in test mode and internally within the integrated circuit for temperature correction when in run mode.

11. A semiconductor device, comprising:
- an integrated circuit formed on a semiconductor substrate, the integrated circuit having at least one component whose operation varies with temperature, and
- at least one testing heating element formed on the semiconductor substrate configured to continuously heat the entire semiconductor device through a temperature range only during an initial testing period; and
- a memory configured to store temperature and operation data from the initial testing period as the entire semiconductor device is continuously heated by the at least one heating element, to correct operation of the at least one component whose operation varies with temperature, during a later run period,
- wherein the at least one heating element formed on the semiconductor substrate is configured to heat the entire integrated circuit through a range of temperature values during the initial testing period such that voltage from the bandgm voltage reference is measured through the range of temperature values as the semiconductor device is heated by the at least one heating element to produce a plurality of voltage values.

12. The semiconductor device of claim 11, further comprising:
- a single temperature sensor on the semiconductor device, configured to monitor temperature of the entire semiconductor device.

13. The semiconductor device of claim 11, wherein the integrated circuit includes a bandgap voltage reference.

14. The semiconductor device of claim 11, wherein the memory is configured to store digital correction data representing a voltage calibration curve generated from the plurality of voltage values during the initial testing period.

15. The semiconductor device of claim 14, wherein the integrated circuit is configured to apply the digital correction data stored in the memory and is configured to correct operation of the integrated circuit to compensate for variation in the reference voltage signal from the bandgap voltage reference during the later run period.

16. The semiconductor device of claim 15, wherein the digital correction data comprises coefficients of a pre-determined polynomial of a predetermined order.

17. The semiconductor device of claim 14, wherein the integrated circuit is configured to generate a voltage correction curve for the bandgap voltage reference and is configured to apply the voltage correction curve to the reference voltage from the bandgap voltage reference to correct variation in analog output of the bandgap voltage reference as a function of temperature.

18. The semiconductor device of claim 11, wherein the at least one heating element formed on the semiconductor substrate comprises one or more of a rail clamp transistor, metal resistor, N-well resistor, deep N-well resistor, P+ resistor, and N+ resistor.

19. A method of correcting operation of an integrated circuit for temperature drift, the integrated circuit comprising at least one heating element located on the semiconductor substrate, the integrated circuit configured to log temperature and operation data in response to heating of the entire integrated circuit by the at least one heating element only in a test mode, the method comprising:
retrieving from a memory coupled to the integrated circuit, temperature correction data stored during the test mode in response to logged temperature and integrated circuit operation data;
correcting operation of the integrated circuit in response to the temperature correction data stored in the memory when in a run mode; and
digitally correcting output voltage of bandgap voltage reference within the integrated circuit in response to temperature measured by the temperature sensor by applying temperature correction data from the memory corresponding to the temperature measured by the temperature sensor when in the run mode.

20. The method of claim 19, further comprising:
sensing temperature of the integrated circuit with a single temperature sensor coupled to the integrated circuit, and
retrieving from the memory, when in the run mode, digital temperature correction data corresponding to the temperature measured by the temperature sensor.

21. The method of claim 19, wherein correcting operation of the integrated circuit comprises:
compensating for drift of the output voltage of bandgap voltage reference within the integrated circuit in response to temperature measured by the temperature sensor by digitally correcting the gain of an analog-to-digital converter coupled to the bandgap voltage reference in response to the temperature data and temperature correction data.

22. The method of claim 20, wherein the test mode comprises:
continuously heating the integrated circuit using the at least one heating element through a range of temperature values; and
testing the integrated circuit by measuring voltage from the bandgap voltage reference within the range of temperature values to produce a plurality of voltage values corresponding to measured temperature values.

23. The method of claim 22, wherein the test mode further comprises:
heating the integrated circuit using the at least one heating element to a maximum operating temperature value;
determining whether the integrated circuit functions at the maximum operating temperature value; and
rejecting the integrated circuit if it fails to operate at the maximum operating temperature value.

* * * * *